United States Patent
Shung

(10) Patent No.: US 10,229,047 B2
(45) Date of Patent: Mar. 12, 2019

(54) APPARATUS AND METHOD OF WEAR LEVELING FOR STORAGE CLASS MEMORY USING CACHE FILTERING

(71) Applicant: Cory Consulting Group, LLC, San Jose, CA (US)

(72) Inventor: Chuen-Shen Bernard Shung, San Jose, CA (US)

(73) Assignee: Wolley INC., San Jose, CA (US)

(*) Notice: Subject to any disclaimer, the term of this patent is extended or adjusted under 35 U.S.C. 154(b) by 29 days.

(21) Appl. No.: 15/230,414

(22) Filed: Aug. 6, 2016

(65) Prior Publication Data

US 2018/0039573 A1 Feb. 8, 2018

(51) Int. Cl.
*G06F 12/02* (2006.01)
*G06F 12/0804* (2016.01)
(Continued)

(52) U.S. Cl.
CPC .......... *G06F 12/0238* (2013.01); *G06F 3/064* (2013.01); *G06F 3/0619* (2013.01);
(Continued)

(58) Field of Classification Search
CPC ............... G06F 12/023; G06F 12/0238; G06F 12/0246; G06F 12/0253; G06F 12/0292; G06F 12/06; G06F 12/0646; G06F 12/08; G06F 12/0802; G06F 12/0804; G06F 12/0891; G06F 12/10; G06F 12/1009;
(Continued)

(56) References Cited

U.S. PATENT DOCUMENTS 9,378,396 B2 6/2016 Cho et al.
2003/0188229 A1 10/2003 Lubbers et al.
(Continued)

FOREIGN PATENT DOCUMENTS

CN 102332290 B 2/2015

OTHER PUBLICATIONS

G. Burr et al., "Overview of candidate device technologies for storage-class memory", IBM Journal of Research and Development 52(4/5): pp. 449-464, Jun. 2008.
(Continued)

*Primary Examiner* — Christian M Dorman
(74) *Attorney, Agent, or Firm* — Blairtech Solution LLC

(57) ABSTRACT

A method and apparatus of wear leveling control for storage class memory are disclosed. According to the present invention, whether current data to be written to a nonvolatile memory corresponds to a write cache hit is determined. If the current data to be written corresponds to the write cache hit, the current data are written to a write cache as well as to a designated location in the nonvolatile memory different from a destined location in the nonvolatile memory. If the current data to be written corresponds to a write cache miss, the current data are written to the destined location in the nonvolatile memory. If the current data to be written corresponds to the write cache miss and the write cache is not full, the current data is also written to the write cache. In another embodiment, the wear leveling control technique also includes address rotation process to achieve long-term wear leveling as well.

19 Claims, 6 Drawing Sheets

(51) Int. Cl.
*G06F 12/1009* (2016.01)
*G06F 3/06* (2006.01)
*G06F 11/10* (2006.01)
*G11C 29/52* (2006.01)
*G11C 29/04* (2006.01)

(52) U.S. Cl.
CPC ........ *G06F 3/0685* (2013.01); *G06F 11/1068* (2013.01); *G06F 12/0804* (2013.01); *G06F 12/1009* (2013.01); *G11C 29/52* (2013.01); *G06F 2212/1036* (2013.01); *G06F 2212/403* (2013.01); *G06F 2212/608* (2013.01); *G11C 2029/0409* (2013.01)

(58) Field of Classification Search
CPC ............. G06F 12/12; G06F 2212/1036; G06F 2212/403; G06F 2212/60; G06F 2212/604; G06F 2212/608; G06F 2212/7201; G06F 2212/7211; G06F 11/1004; G06F 11/1068; G06F 3/0619; G06F 3/064; G06F 3/0685; G11C 29/52
See application file for complete search history.

(56) References Cited

U.S. PATENT DOCUMENTS

| | | |
|---|---|---|
| 2013/0339570 A1 | 12/2013 | Franceschini et al. |
| 2013/0339574 A1 | 12/2013 | Franceschini et al. |
| 2014/0059284 A1 | 2/2014 | Fang et al. |
| 2014/0129767 A1 | 5/2014 | Ramanujan et al. |
| 2014/0297938 A1 | 10/2014 | Puthiyedath et al. |
| 2015/0058547 A1 | 2/2015 | Thatcher et al. |
| 2015/0186279 A1* | 7/2015 | Dong .................. G06F 12/0833 711/135 |

OTHER PUBLICATIONS

M.K. Qureshi et al., "Enhancing lifetime and security of PCM-based main memory with start-gap wear leveling", Proceedings of the 42nd Annual IEEE/ACM International Symposium on Microarchitecture, pp. 14-23, Dec. 2009, hereafter referred as Qureshi 2009.

* cited by examiner

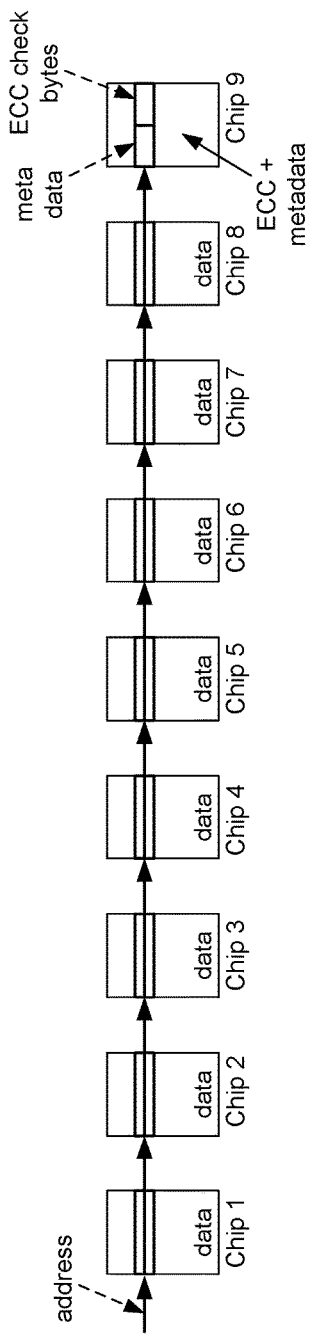

APPARATUS AND METHOD OF WEAR LEVELING FOR STORAGE CLASS MEMORY USING CACHE FILTERING

FIELD OF THE INVENTION

The present invention relates to memory control. In particular, the present invention relates to wear leveling for memory device in order to extend the endurance of the memory device.

BACKGROUND AND RELATED ART

In computer architecture the memory hierarchy is a concept used for storing and discussing performance issues in computer architectural design, algorithm predictions, and the lower level programming constructs such as involving locality of reference. The memory hierarchy in computer storage distinguishes each level in the hierarchy by response time. Since response time, complexity, and capacity are related, the levels may also be distinguished by their performance and controlling technologies.

In the context of this disclosure, the memory hierarchy of interest consists of (a) processor registers, (b) caches (L1, L2, L3, etc.), (c) main memory, and (d) disk storage. For memory devices that are "farther" away from the CPU (or "lower" in the memory hierarchy), the capacity is bigger while the response time is longer. The capacity of these memory devices is in the order of (a) less than Kilobytes, (b) Megabytes to tens of Megabytes, (c) tens of Gigabytes, and (d) Terabytes, respectively. The response time of these memory devices is in the order of (a) sub-nanoseconds, (b) nanoseconds, (c) tens of nanoseconds, and (d) tens of milliseconds for random access of Hard Disk Drives (HDDs), respectively. In recent years, one of the major technology advancement in memory hierarchy has been the wider adoption of solid-state disks (SSDs), built with NAND Flash, which improves the disk response time to tens of microseconds.

Even with SSDs, there is still a big gap in response time between (c) and (d). On top of that, (a)-(c) are "byte-addressable" (although in practice, memory hierarchy levels (b)-(c) are often addressed with 64-byte unit), while memory hierarchy level (d) is "block-addressable" with a minimum 4K-byte block. In computer terms, the former is a "memory access" while the latter is a "storage access" or "I/O (Input/Output) access". The different access semantics and block transfer size also increase the overhead of accessing the disk.

One attempt to avoid the disk access as much as possible, in order to improve performance, is to increase the main memory capacity. However, due to cost and power reason, there is a bound to this investment, especially as the Moore's Law scaling for DRAM will no longer be able to reduce cost and power much more. Furthermore, given the overwhelming trend of cloud computing and big data applications, the data size of interest is getting bigger and bigger, and hence simply trying to increase main memory capacity will lose in this foot race.

Other than response time and capacity difference, there is also another significant difference between memory and disk. Memory is volatile and disks (SSDs or HDDs) are non-volatile. When power is lost, the memory content is lost, while the disk content is kept. It is very important for online transaction processing (OLTP) to write the results to some non-volatile storage to formally complete the transaction to safeguard against unexpected power loss. This is another reason why disk operations are necessary. How to efficiently interacting with disks while not slowing down the operation performance has been an active topic of research and development by computer scientists for decades.

It is therefore intuitively obvious that it would be ideal to have a memory device that has the response time and byte-addressable property of the memory, and the capacity and non-volatile property of the disks. This kind of memory is generally referred to as the Storage Class Memory (SCM) (G. Burr et al., "Overview of candidate device technologies for storage-class memory", *IBM Journal of Research and Development* 52(4/5): pp. 449-464, June 2008). In the past many years, there were numerous attempts by different companies and research groups to develop SCMs using different materials, processes, and circuit technologies. Some of the most prominent examples of SCMs to date include Phase Change Random Access Memory (PCRAM), Resistive Random Access Memory (RRAM), and Spin-transfer torque Magnetic Random Access Memory (STT-MRAM). Recently, Intel™ and Micron™ announced advanced SCM, that is claimed to be "1000 faster than NAND flash and 10 times denser than DRAM. If SCMs become available, many believe that a natural place in the memory hierarchy for SCMs will be between memory hierarchy level (c) and memory hierarchy level (d) mentioned above to bridge the gap in between.

One common characteristic of SCMs, which is also shared by NAND flash, is that these memory devices have finite write endurance. As the functionality of a memory device is to support data written to and read from, a memory device with finite write endurance means that it cannot be written indefinitely. The number of times they can be written varies for different kinds of SCMs or NAND flash. Recent TLC (Triple-Level Cell) 3D NAND flash may endure as few as several thousand writes. SCMs usually can endure a few orders of magnitude more than NAND flash, but are also orders of magnitude worse than convention DRAM (which usually quoting write endurance around $10^{15}$).

One important (and arguably necessary) technique that needs to be developed for any memory device with finite write endurance is called wear leveling. If a particular memory location is being written too many times exceeding the write endurance, then the memory location cannot be used reliably for subsequent memory operations. Hence to prolong the lifetime of such memory devices, it is best to write to every memory location about the same number of times (hence the "wear" is "leveled"). But since the addressing pattern is application dependent, and cannot be steered to observe the equal wear constraint, it is up to the memory subsystem to perform wear leveling without the cooperation or awareness from the host application.

Simply put, a wear leveling technique needs to optionally write to a different memory location than what is required by the application program. Otherwise, the wear is determined by the addressing pattern of the application program and there is no defense from the memory devices. NAND flash in general uses a table to map the logical address (which the application program wants to write to) to the physical address (which the NAND flash actually writes to). The same logical address could be mapped to different physical address at different time, and hence the wear is leveled. Recall that NAND flash is a block addressing device with a minimum addressing unit of 4K-byte, hence the mapping table can be constructed at about a size that is 0.1% of the storage size. (e.g., for 1 Terabyte of SSD, the table is about 1 Gigabyte.) Since this table search is on the critical path of NAND flash memory access, the table is usually implemented by faster technology such as DRAM.

Unfortunately this general table-mapping wear-leveling technique cannot be used for SCMs. As SCMs are byte-addressable, a much smaller unit than the 4K-byte block, if we attempt to adopt the table mapping wear leveling technique, the table size will be in the same order as the storage size. This defeats the purpose and negates the advantage of SCMs.

In this disclosure, I describe one wear-leveling invention that is designed for SCMs. To summarize the motivation of this invention, SCMs are being sought as the ideal new introduction to the memory hierarchy that has the response time and byte-addressable property of the memory, and the capacity and non-volatile property of the disks. The present invention is to provide an innovative wear-leveling technique to address the write endurance issue for SCM.

BRIEF SUMMARY OF THE INVENTION

A method and apparatus of wear leveling control for storage class memory are disclosed. According to the present invention, whether current data to be written to a nonvolatile memory corresponds to a write cache hit is determined. If the current data to be written corresponds to the write cache hit, the current data are written to a write cache as well as to a designated location in the nonvolatile memory different from a destined location in the nonvolatile memory. If the current data to be written corresponds to a write cache miss, the current data are written to the destined location in the nonvolatile memory. If the current data to be written corresponds to the write cache miss and the write cache is not full, the current data is also written to the write cache. The present technique is able to achieve short-term wear leveling for storage class memory.

In another embodiment, the cache filtering technique is combined with address rotation process to achieve long-term wear leveling as well. According to the address rotation process, a set of N input addresses are mapped to a set of M output addresses with M and N being positive integers and M>N. The mapping between the set of N input addresses and the set of M output addresses are fixed within a time period T, and the mapping modifies only one of the set of N input addresses in each next time period. N memory groups are used as data groups and one or more memory groups are used as redundant groups, and M is equal to a sum of N and number of the redundant groups. The redundant groups are divided into one or more logging groups and a shadow group in unused memory space of the nonvolatile memory and the unused memory space of the nonvolatile memory corresponds to memory space not used as destined locations for storing data.

Another aspect of the present invention addressed handling damaged locations in the nonvolatile memory for a storage class memory with wear leveling feature. Similar as above, the nonvolatile memory is divided into memory groups and mapping N input group addresses to M output group addresses causes N data groups among M memory groups are used to store the input data in a rotated fashion. If a damaged address location in one of the data groups is found, a repair entry in the write cache is created for the damaged address location with the last known correct data content. The repair entry in the write cache is kept updated by updating the timestamp of the repair entry to prevent the contents in the repair entry from being flushed to the damaged address location.

Another aspect of the present invention addressed sharing ECC (Error Correcting Codes) check bytes and metadata associated with wear leveling in same nonvolatile chip(s) of the nonvolatile memory. The method configures D nonvolatile-memory chips to store input data and E nonvolatile-memory chips to store extended data for each data address in the nonvolatile memory. D and E are positive integers. Similar as above, the nonvolatile memory is divided into memory groups and mapping N input group addresses to M output group addresses causes N data groups among M memory groups are used to store the input data in a rotated fashion. The Error Correction Code (ECC) check bytes and metadata associated with the data groups and the redundant groups are stored in the E nonvolatile-memory chips. The metadata corresponding to information related to said mapping N input group addresses to M output group addresses to cause N data groups among M memory groups used to store the input data in a rotated fashion.

BRIEF DESCRIPTION OF THE DRAWINGS

FIG. 1 illustrates an example of configuring nonvolatile memory chips to share the storage of Error Correction Code (ECC) check bytes and metadata associated with the data groups in same nonvolatile-memory chips.

FIG. 2 illustrates an example of metadata structure associated with address rotation.

DETAILED DESCRIPTION OF THE INVENTION

Figure 3:
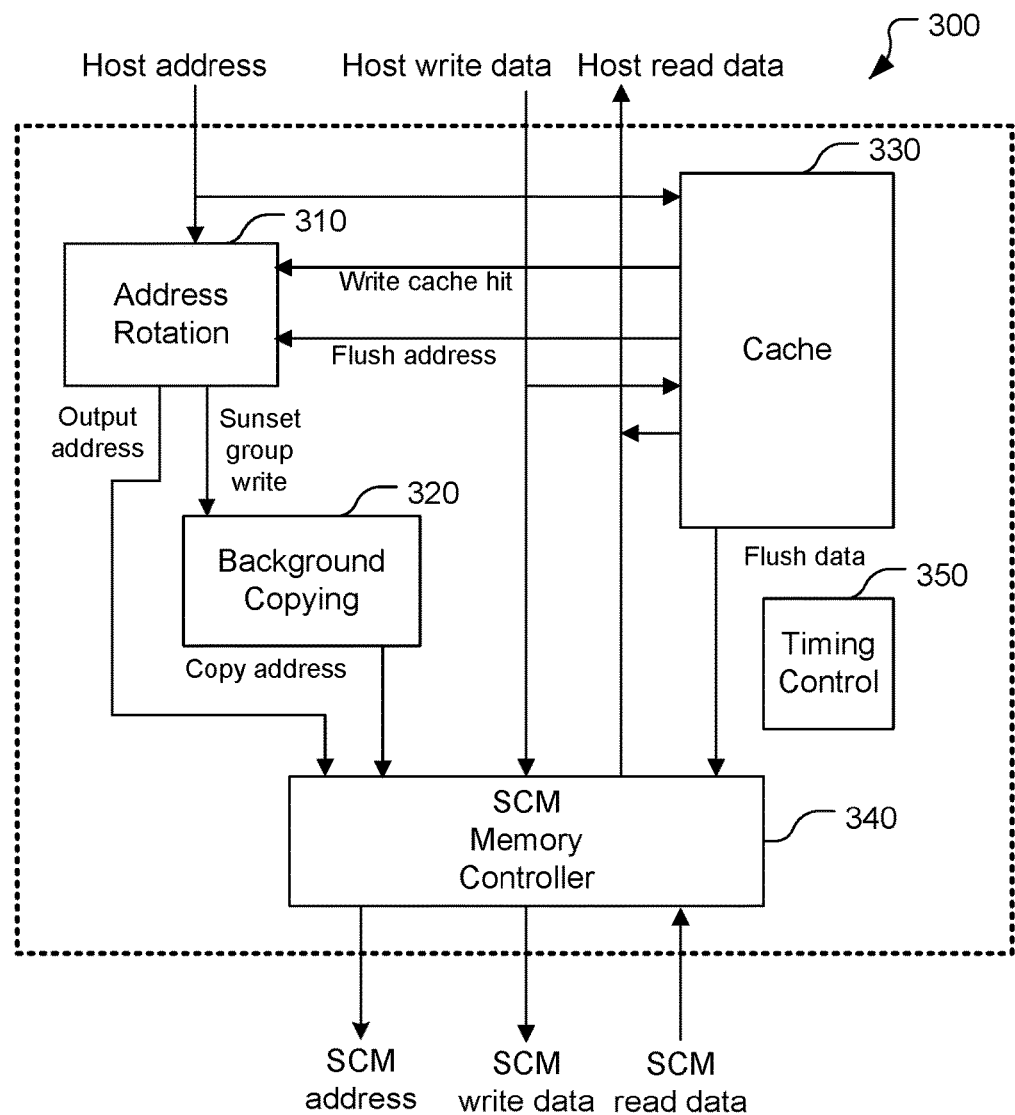
FIG. 3 illustrates an exemplary system block diagram of a storage class memory (SCM) with wear leveling capability according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

A wear leveling technique for PCRAM has been disclosed in 2009 by Qureshi et al. (M. K. Qureshi et al., "Enhancing lifetime and security of PCM-based main memory with start-gap wear leveling", Proceedings of the 42nd Annual IEEE/ACM International Symposium on Microarchitecture, pp. 14-23, December 2009, hereafter referred as Qureshi 2009). The so-called start-gap wear-leveling is a special form of address rotation. Address rotation is a time-varying mapping between a set of input addresses $(ai_1, ai_2, \ldots, ai_N)$ and another set of output addresses $(ao_1, ao_2, \ldots, ao_M)$, where M>N, and the mapping is fixed within a time period T. Different ai's will be mapped to different ao's, where no two ai's can be mapped to the same ao. Over time, $ai_j$ will be mapped to $ao_k, ao_{(k+1)}, \ldots, ao_M, ao_1, ao_2, \ldots, ao_{(k-1)}$ in sequence, then back to $ao_k$, hence the name address rotation.

Without loss of generality, let us use an example of M=N+1 to illustrate the operation.

To start out, for $0 < t < T$:

$ai_1 \to ao_1$ $ai_2 \to ao_2$

...

$ai_{(N-1)} \to ao_{(N-1)}$ $ai_N \to ao_N$.

In the next period, $T < t < 2T$, $ai_1 \to ao_1$ $ai_2 \to ao_2$

...

$ai_{(N-1)} \to ao_{(N-1)}$ $ai_N \to ao_{(N+1)}$, (i.e., $ai_N$ moves and only $ai_N$ moves), then in the following period, for $2T < t < 3T$:

$ai_1 \to ao_1$ $ai_2 \to ao_2$

...

$ai_{(N-2)} \to ao_{(N-2)}$ $ai_{N(N-1)} \to ao_N$, (i.e., $ai_{N(N-1)}$ moves and only $ai_{N(N-1)}$ moves), $ai_N \to ao_{(N+1)}$.

Specifically, during each period, only one input address changes its mapping to the next output address in sequence. After N periods, all input addresses will change its mapping to the next output addresses. Since M>N, there are "empty" spaces (or "gaps") to allow such address rotation to operate. From the simple illustrating example, it should be clear that the input address $ai_k$ could be mapped to any of $ao_1$, $ao_2, \ldots, ao_M$, given enough time periods.

The above example illustrates the precise wear leveling. Let the input address be the logical address that the application program wants to write, through address rotation, the same logical address will be mapped to different output addresses which are the physical addresses used in the SCM operation. If the writes are concentrated on one particular logical address, the address rotation scheme can help to redistribute the writes to M physical addresses to level the wear. The address rotation is also relatively easy to implement, and it does not require a mapping table to be constructed.

The Qureshi 2009 reference suggests the period T itself be dynamic. If $ai_k$ is the input address that is to be remapped during the period, it suggests that the remapping happens after a certain number of writes to $ai_k$ occurs. This proposal requires a lot of bookkeeping of how many writes has occurred and where the write operations write to. But in fact even if lots of writes occur in a different address from $ai_k$, the need for wear leveling is no different, while the only moveable mapping still is $ai_k$. Therefore, it is assumed in this disclosure that a carefully chosen fixed time period T should be as good, and it minimizes the bookkeeping.

The Qureshi 2009 reference does not consider the "group address rotation" concept. Although the address rotation can be applied to individual addresses, to simplify the implementation without loss of wear leveling performance, a number of addresses are grouped and rotated together according to one embodiment of the present invention. In other words, address rotation should operate on the most-significant-bits (MSBs) of the addresses. For example, if the entire address space of interest is partitioned into 64 groups, only the 6 MSB bits are needed in the address rotation computation.

Address rotation, especially with improvements of fixed-time-period and group address rotation, is straightforward to implement, but it only brings a long-term wear leveling effect, and not a short-term wear leveling effect. Notice that in the N time periods, each address is stationary in (N−1) time periods, or over (N−1)*T time. Hence if the application program wants to write to a particular address repetitively during (N−1)*T time, the address rotation scheme does not help in wear leveling. It only helps if the repetitive writes last longer than (N−1)*T. Now N is designed to be a large number to allow addresses being rotated among a large number of alternatives, while T cannot be reduced too much as it will increase write performance overhead. Hence (N−1)*T may not be a small amount of time over which address rotation is not effective.

In order to improve the performance of wear leveling endurance, the present invention discloses a new wear leveling scheme, called cache filtering, which can be used in conjunction with address rotation. Cache filtering is effective for short-term wear leveling, where address rotation scheme is not. Therefore cache filtering and address rotation are a good combination.

A brief summary of basic read and write cache design is described as follows. A cache is usually faster but smaller than the main memory unit, and it stores a subset of the content in the main memory unit. Throughout this disclosure, if it is not specified otherwise, the main memory unit in discussion is assumed to be an SCM. Cache is useful as the addressing pattern has locality—there is a good probability to read or write the addresses that were just previously accessed. In the read operation, the recently read content is copied to the cache, and if it is being read again, then it can be read from the cache to gain performance. In the write operation, the recently written content is first written to cache instead of the main memory unit. If a new write to the same location occurs again, then it can be written to the cache, thereby saving some write operations to the main memory unit. Usually read and write caches are implemented as one cache, in which there is "dirty" bit in each cache entry to denote whether the cache entry is different (i.e., newer) from the main memory counterpart or not.

In the cache filtering scheme, the read cache part is the same as an ordinary read cache. However, the write part is different. Normally, the write to cache operation will write to cache without writing to the main memory. In the cache filtering scheme, during a write operation, if a cache hit occurs, then the write operation will write to cache and also write to a different location in the main memory from the destined address location. The dirty bit of the cache entry will be set, as the cache entry content is now different (i.e., newer) from the content in the destined address location. There are two cases for write cache misses. The first one is that if the write cache is not full, then the new entry will be written to the write cache as well as the main memory unit in the destined address location. The other case is that if the cache is full (and no entry could be retired), then the new entry will only be written to the main memory unit in the destined address location, and not to the write cache.

The purpose of write cache in the cache filtering scheme is to detect and filter what addresses are recently written. Thus, for the purpose of wear leveling, those contents can be logged to some temporary memory locations different from what the addresses are destined to. However, there is an issue regarding where the temporary memory space to use for such logging writes is. Recall that in address rotation, M>N, and there are some memory space that are currently not being mapped. These logging writes shall be written to one of the unused memory space. Along with address rotation, the memory space used for logging writes will also be rotated over time.

The cache entries will be retired when they are not accessed for a while. There are many techniques we can choose to determine when and which entry to retire. A write cache entry is flushed to the destined address location only when it is being retired and the dirty bit is set. If sudden power loss occurs before the write cache entry is flushed to the destined address location, though the content of volatile write cache is lost, the content in the non-volatile temporary locations can be used to restore the correct content to the destined address location.

Let us examine and compare how architectural choices handle K repetitive writes to the same memory address. The architectural choices correspond to (1) without write cache, (2) with traditional write cache, and (3) cache filtering. For a memory system without cache, the destined address location will be subject to K writes if these K writes happen within (N−1)*T. For a memory system with traditional write cache, the write cache will absorb most of the writes, and the destined address location is written much fewer times. As the write cache is volatile, if sudden power loss occurs, the content of the write cache will be lost. This is catastrophic if some of the write cache entries were dirty before power loss. If the host is stalled until all dirty write cache entries are flushed, there will be significant performance impact. For a memory system with cache filtering, the memory subsystem will be written K+1 times, but only one time to the destined address location. Among the three architectural choices, only cache filtering can level the wear and is not susceptible to sudden power loss.

How to build a wear leveling architecture that combines address rotation and cache filtering is disclosed as follows. Without loss of generality, the characteristics of a generic SCM are described to illustrate an example of the wear leveling design.

The total capacity of a SCM memory system can be determined according to (D+E)*C (measured in bytes), where C is the capacity of each SCM chip, D chips are used to store the data portion, and E chips are used for error-correcting code (ECC) check bytes portion and some metadata used for data management. Each SCM chip has an I/O data with z-bit data width, and an appropriate-sized address bits depending on the capacity. Each SCM can be clocked at a maximum of U (measured in MHz), with a double-data-rate (DDR) signaling. In other words, at each clock cycle, 2*z bits will be available for each SCM chip. The SCM chip has a read latency of $t_R$ and a write latency of $t_W$ (both measured in nanoseconds). Furthermore, it also assumes that the SCM chip has P partitions and the partitions can be read and written independently and in parallel.

To put things in perspective, the $t_R$ and $t_W$ of SCM is larger than those of DRAM, and smaller than those of the NAND flash. Using the parallel partitions, SCM can recover some performance compared to DRAM. This is because the I/O bandwidth of SCM (determined by U and z) is closer to that of DRAM, than $t_R$ or $t_W$. Even if each read/write task takes longer to finish, launching several read/write tasks in parallel is an effective way to fill up the I/O, thereby narrowing the performance gap.

A portion of the D SCM chips and corresponding E SCM chips may share the same address bits. These groups of SCM chips will be referred to as a region. For example, if 8 D chips and 1 E chip share the same address, and C is 16 Gigabytes, then the size of a region is 128 Gigabytes. If 8 D chips and 1 E chip share the same address and z=8, then at each cycle, the available data is (8+1)*8*2 bits=18 bytes.

FIG. 1 illustrates an example of configuring nonvolatile memory chips to share the storage of Error Correction Code (ECC) check bytes and metadata associated with the data groups in same nonvolatile-memory chips. A total of 9 chips are used for a region of the SCM, where 8 chips (chips 1-8) are used to store data and 1 chip (chip 9) is used to store ECC data and metadata. For each address location as shown in the location pointed by the arrows, the data is stored in the first 8 chips. The ECC part and the metadata are stored in chip 9.

In practice, the minimum access unit for main memory is at least 64 bytes. Suppose we design a main memory with a minimum access unit of 128 bytes, then each memory access will see 8 consecutive cycles to provide a total of 144 bytes, out of which 128 bytes are data. The significance of this is two-fold. First, a "bigger" ECC block (128 data bytes) can be employed for SCM for better error correcting capability. This is traditionally not used for DRAM due to the higher decoder latency. However, for SCM, since $t_R$ is larger, the higher decoder latency has a much smaller impact. Second, when the data from E chip can be organized in blocks, there will be more room to put in some metadata for wear leveling. This factor is probably more important for our discussion.

The entire SCM memory system can be divided into a number of regions. Each region is a basic unit for address rotation. The address space of each region is further partitioned into M groups. Most of the groups in a region are used to store data, called data groups, except for two types of groups, shadow group and logging groups. The shadow group and the logging groups together are called the redundant groups, since they are the memory overhead for wear leveling. A suitable number of logging groups can be selected for a memory system. For example, if the 128 Gbyte region is partitioned into 64 groups with 1 shadow group and 2 logging groups, only 122 Gbyte of memory space is useable to store data.

At any given time, there is a background process to copy the content of one of the data groups, called the sunset group, to the shadow group. The time period of this copying process is T. T is designed such that this background copying (writing) process takes only a small portion of the writing bandwidth (e.g., smaller than 1-2%). After time T, the shadow group will assume the identity of the previous sunset group and become one of the data groups. The sunset group will join the redundant groups. In order to rotate among redundant groups, the sunset group will join as one of the logging groups, and one of the logging groups will take the position of the new shadow group, and so on. In this fashion, every group will rotate its role among data groups, logging groups and shadow groups after M*N*T time.

The way to differentiate the group types is by a group label stored as part of the metadata in SCM. The following example illustrates how the group labels change over time to reflect their changing types. In this example, M=64.

| | 8 | 16 | 24 | 32 | 40 | 48 | 56 |
|---|---|---|---|---|---|---|---|
| 1 | 9 | 17 | 25 | 33 | 41 | 49 | 57 |
| 2 | 10 | 18 | 26 | 34 | 42 | 50 | 58 |
| 3 | 11 | 19 | 27 | 35 | 43 | 51 | 59 |
| 4 | 12 | 20 | 28 | 36 | 44 | 52 | 60 |
| 5 | 13 | 21 | 29 | 37 | 45 | 53 | ⊕ |
| 6 | 14 | 22 | 30 | 38 | 46 | 54 | ⊚ |
| 7 | 15 | 23 | 31 | 39 | 47 | 55 | ⊛ |

In this example, group label 0 the sunset group, and group label 61 is the shadow group, group label 62, 63 are the logging groups, respectively. During this time, the input address is equal to the output address, for input address 0 to 60.

After time T, group label 64 will be written to the group that used to be labelled 0, to produce the following group labels:

| ⊛ | 8 | 16 | 24 | 32 | 40 | 48 | 56 |
|---|---|---|---|---|---|---|---|
| ☐ | 9 | 17 | 25 | 33 | 41 | 49 | 57 |
| 2 | 10 | 18 | 26 | 34 | 42 | 50 | 58 |
| 3 | 11 | 19 | 27 | 35 | 43 | 51 | 59 |
| 4 | 12 | 20 | 28 | 36 | 44 | 52 | 60 |
| 5 | 13 | 21 | 29 | 37 | 45 | 53 | 61 |
| 6 | 14 | 22 | 30 | 38 | 46 | 54 | ⊕ |
| 7 | 15 | 23 | 31 | 39 | 47 | 55 | ⊚ |

Now group label 1 becomes the sunset group, group 62 becomes the shadowing group, and group 63, 64 are the logging groups. Group 61 now becomes a data group. In the current time period, input address equals output address for address from 1 to 60 while input address 0 will be mapped to output address 61.

Similarly, in the next time period, the status is shown as follows and the address rotation process continues.

| ⊚ | 8 | 16 | 24 | 32 | 40 | 48 | 56 |
|---|---|---|---|---|---|---|---|
| ⊛ | 9 | 17 | 25 | 33 | 41 | 49 | 57 |
| ☐ | 10 | 18 | 26 | 34 | 42 | 50 | 58 |
| 3 | 11 | 19 | 27 | 35 | 43 | 51 | 59 |
| 4 | 12 | 20 | 28 | 36 | 44 | 52 | 60 |
| 5 | 13 | 21 | 29 | 37 | 45 | 53 | 61 |
| 6 | 14 | 22 | 30 | 38 | 46 | 54 | 62 |
| 7 | 15 | 23 | 31 | 39 | 47 | 55 | ⊕ |

Notice in this design, the group labels will always be 64 consecutive numbers. If we use 8 bits to store such labels, they will be consecutive in a modulo-256 sense (i.e., . . . , 254, 255, 0, 1, . . . considered as consecutive). The smallest group label will always be the sunset group, while the three largest group labels will be the redundant groups. The comparison of their sizes is also in modulo-256 sense, and hence 0 is larger than 255 by 1. Since there can be 64 consecutive numbers at any time, there will be no confusion. At any given instance of time, the 64 consecutive group labels can be used to deduce the state of the address rotation—group type of each group, and how the input and output address mapping should be.

While specific examples are shown above to illustrate the group labels change over time so as to reflect their changing types. These examples shall not be construed as limitations to the present invention.

As these group labels are stored in the SCM, even after a power loss, the system can restore the state of the address rotation by these group labels. Even though the exact state of the background copying from sunset group to shadow group is unknown, after the power loss, we can restart the time period T, and redo the background copying from the beginning of the group.

In the case of shared storage for ECC data and metadata, the ECC data are always stored in the ECC part of the nonvolatile memory for all types of memory groups. The respective metadata for corresponding memory groups are stored in the metadata part of the nonvolatile memory. For each data group or the shadow group, the metadata includes only a group label. For each logging group, the metadata includes a group label, host addresses, timestamps associated with the host addresses. FIG. 2 illustrates an example of metadata structure associated with address rotation.

There is another time period, $t_L$, for which the logging groups are being recycled. The time period, $t_L$ depends on the write cache size and the maximum write throughput. It is designed such that under maximum write throughput and every write is a cache hit, then during $t_L$ time, such writes will not overflow a portion of a logging group. In a proper system design, T is much larger than $t_L$ and shall be an integer multiple of $t_L$. In logging group operations, each logging group can be partitioned into multiple logging units. For example, the two logging groups are further divided as four logging units. Each logging unit is half of a logging group. When a write cache hit happens, the data and the original input address will be logged in one of the logging units, called the active logging unit, which has a current pointer that determines when the next logging write will be written, and the current pointer shall move sequentially. A write cache hit means that the data to be written to the nonvolatile memory is already in the cache memory or the write cache memory if separate write cache and read cache memories are used. In the next $t_L$ time period, a different logging unit will become the active logging unit, and so on. Each logging unit will serve as active logging unit in order.

Inside the write cache, for each entry, in addition to data content and input address, there are a valid bit, a dirty bit, and a timestamp field. The valid bit indicates whether the location has a valid entry or not. The dirty bit indicates whether there has been any logging write occurring for the entry or not. The timestamp indicates during which $t_L$ time period the entry was last updated. The timestamp will increment by 1 over each $t_L$ time, and it can wrap around. With the timestamp field, we can tell which write cache entry was not updated for a while, which will have a timestamp field that is smaller than the current timestamp by a design parameter. There is a background process to examine the write cache and to flush out such old entries to leave space for new write entries. The flush writes will be written to the destined address location.

As the logging units each assumes the role of the active logging unit in order, there is an issue regarding how to prevent the logging writes from overwriting what had been logged before. This is guaranteed by the proper operation of the write cache. If the particular entry has seen an update after the previous logging write, then the old logging write can be erased. If the particular entry has not seen an update after the previous logging write, then the entry must have an old timestamp in the write cache, and will be flushed. This is why the logging groups can be recycled and keep on logging.

When logging group performs logging writes, it also stores the timestamp as the metadata. The timestamp field is used by the SCM controller to determine the state of the logging units, similar to how the group labels are used to determine the state of the address rotation. As there are multiple logging units, they will take an incrementing timestamp field until it wraps around. The logging unit with the largest timestamp (also in a modulo sense) is the current active logging unit. When power loss occurs, by examining the timestamp fields in the logging units we can determine which logging unit was the active logging unit prior to the power loss. From that we can determine which logging unit's data needs to be restored, and which logging unit's data can be ignored. As can be seen in FIG. 2, if we spare one particular location (say lowest address location) not used for logging writes, then we can use the same field for group label and timestamp, and not taking too much space of the metadata.

FIG. 3 illustrates the block diagram of the SCM wear leveling architecture 300. On the host side, the interface signals include host address, host read data and host write data. On the SCM side, the interface signals include SCM address, SCM read data and SCM write data. The system incorporating an embodiment of the present invention may include address rotation unit 310, background copying unit 320, cache unit 330, timing control unit 350, and SCM memory controller unit 340. Nevertheless, an embodiment of the present invention may exclude the address rotation. The address rotation unit 310 determines the input (host) address and output (SCM) address mapping. The background copying unit 320 performs the copying of sunset group to shadow group. The cache unit 330 integrates a read cache and a write cache. The SCM memory controller 340 receives multiple SCM memory access requests from various functional units and prioritizes these requests to achieve optimum performance. Timing control unit 350 manages time unit T and $t_L$, and informs the address rotation unit and background copying unit when T time period is up, and informs the cache unit when $t_L$ time period is up.

The read operation is relatively straightforward. The host address is sent to the read cache, and if it is a hit, then the host read data can be obtained from the read cache. If it is a miss, then the address rotation unit will map the host address to an output address which is sent to the SCM memory controller to perform a SCM read. The SCM read data will be the resultant host read data. The newly SCM read data shall enter the read cache, replacing some read cache entry if the read cache is full. For each host read, there may or may not be an SCM read.

The write operation is more complicated. The host input address is sent to the write cache, and if it is a hit, then the write cache entry is updated with a dirty=1, a new timestamp, and new data. Once the write cache hit signal is sent to the address rotation unit, the output address will be the current pointer of the active logging unit, and a SCM write will be performed onto the logging unit. In the logging write, the host address will be stored in SCM as the metadata. If it is a miss, and the write cache is not full, then the write cache entry is created with dirty=0, a new timestamp and host data. The address rotation unit will produce the mapped output address to perform an SCM write. If it is a miss but the write cache is full, then the address rotation unit will produce the mapped output address to perform an SCM write, but the write cache is not changed. For each host write, there will always be one SCM write.

There are two other background write operations and one background read operation. The background copying unit sends copy address to the SCM memory controller to read from the sunset group, and then write to the shadow group. However, it also receives signals from the address rotation unit if the host write is writing to the sunset group. If so, the background copying unit needs to examine whether the address has been copied already, and if so, it needs to update the shadow group with the new data.

The other background write operation is the flush writes from the cache unit. The cache unit has a background process to flush any entries that has timestamp that are smaller by a designed parameter than the timestamp corresponding to the current $t_L$ time period. During the flush write, the cache unit sends the flush address to the address rotation unit to obtain the mapped output address to write to.

The SCM has P partitions that can perform read or write independently. This can be exploited by the SCM memory controller to parallelize the operations and maximize the performance. Among the different types of read and write operations, the SCM memory controller shall prioritize the foreground read and write operations, such as host-induced SCM read and write operations, and logging write operations. The background operations, such as background copying and flush write operations will be performed with a lower priority.

Figure 4:
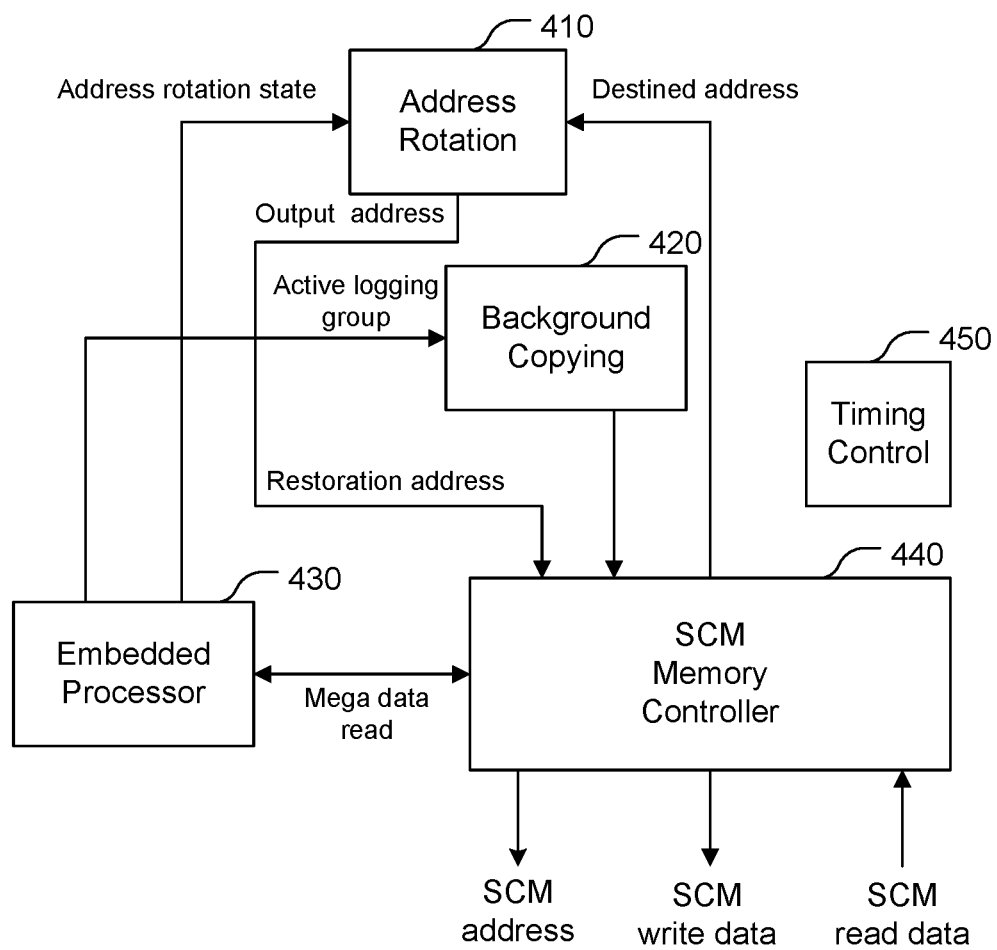
FIG. 4 illustrates an exemplary system block diagram of a storage class memory (SCM) with wear leveling capability in power loss recovery according to an embodiment of the present invention.

FIG. 4 illustrates the functional blocks that are involved in the sudden power loss recovery. When power is lost, the entire content in the cache is assumed to be lost. Once power is back up, we assume the embedded processor 430 takes control to restore the SCM into full operation state. The embedded processor is dormant in normal operation and hence is not shown in FIG. 3. The SCM memory controller 440, which is stateless, is used by the embedded processor to retrieve metadata from SCM such as the group labels. From the group labels, the embedded processor can determine which groups are data groups, shadow group and logging groups, respectively. From this information, the address rotation unit 410 is restored.

The embedded processor reads the timestamp fields of the logging units to decide which one was the active logging unit, and what was the latest timestamp. The embedded processor then configures the background copying unit 220 to perform the restoration job. This restoration job is different from the regular background copying in the sense that the destined address is obtained from the stored host address field in the metadata. Such address will need to be sent to the address rotation unit to find the mapped output address to write to.

Once the necessary logging group data are restored, the embedded processor then re-instates the timing control block. A new time period T will restart with the current address rotation state, and a new time period $t_L$ will also restart with an empty cache and clean logging groups. The SCM is now back to full normal operation, and the embedded processor will go back to the dormant state. Since the heavy lifting data movement is handled by the background copying block in its restoration mode, the restoration speed can be very fast.

Despite the best attempt of wear leveling, in real situation the address locations still cannot be utilized absolutely evenly. In case some address locations are worn more than others, they may exhibit degraded reliability. From ECC decoding, we can observe increasing number of errors to be corrected, or in the worst case, the number of errors may be too large to be decodable. Our invention can help to deal with such damaged address locations, in order to further extend the life time of SCM.

Suppose address location x is found to be damaged. First of all, such information needs to be stored in the SCM, and not just the controller, in case it is lost after a power loss. Then we will make x known to the address rotation unit (and upon every restoration after power loss, such information should also be restored). If x belongs to a current data group, then a special repair entry will be created in the write cache for x, with the last known correct data content. Now within T, such repair write cache entry will be kept current regardless there is a cache hit or not. In particular, during every $t_L$ time a background process will refresh the cache entry with the old data content, and trigger a logging write, even if there is no write cache hit. Effectively, some other SCM locations in the logging groups will take place for x for reliable storage. Since logging groups rotate, this load is shared by all other groups in a random fashion. By keeping the write entry current, there will never be a flush write attempting to write it back to x.

If x belongs to a sunset group, then in addition to the above, the background copying unit will not copy from x, and it will copy from the write cache. Afterwards, when x belongs to a logging group, its location will be skipped over and not used for logging. If x belongs to a shadow group, then instead of copying to x, a repair write cache entry will be created. In our scheme, the repair write cache will always be created while in the shadow group, and the repair write cache shall be kept current throughout the entire time the group is a data group until it sunsets. Since the repair cache entry is created during shadow group, it has the last known correct data content from the background copying process.

Figure 5:
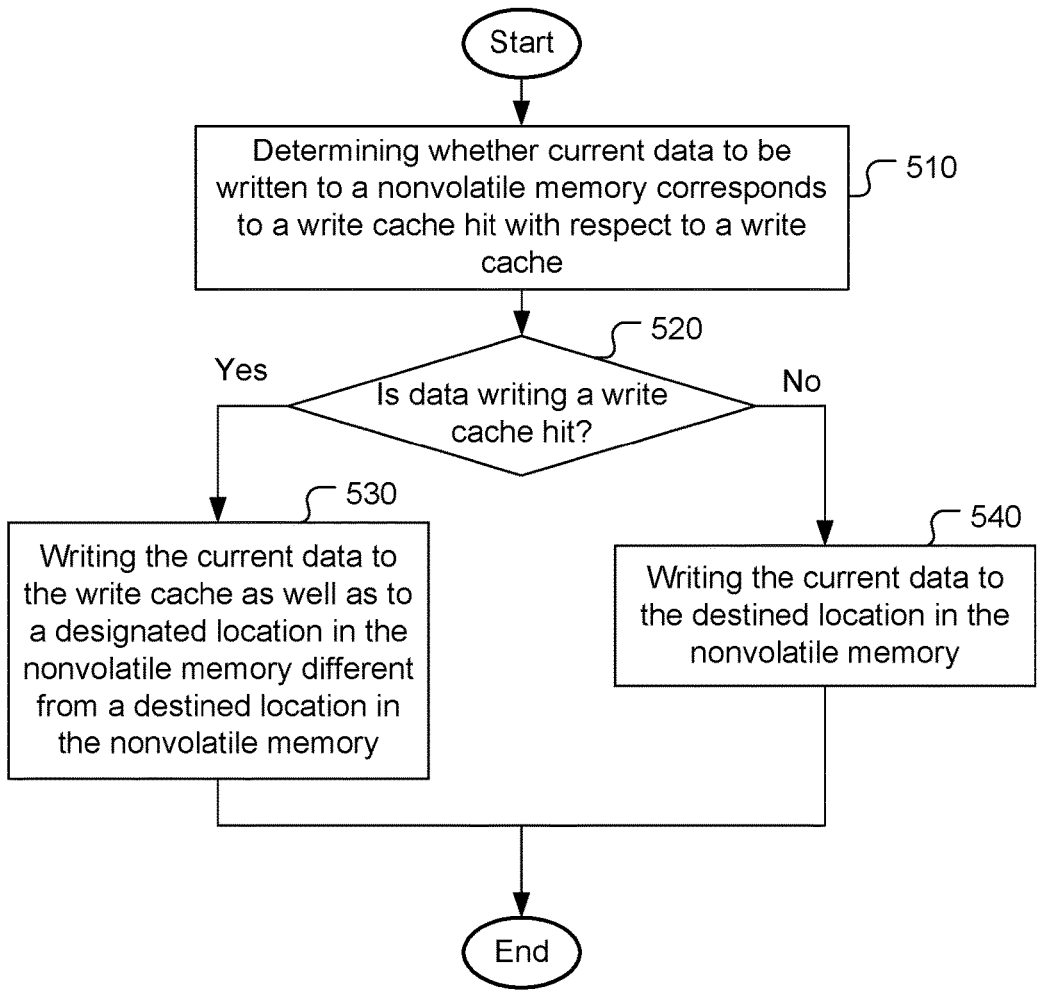
FIG. 5 illustrates an exemplary flowchart of a storage class memory (SCM) with wear leveling capability according to an embodiment of the present invention.

FIG. 5 illustrates an exemplary flowchart of wear leveling control according to one embodiment of the present invention. The system first determines whether current data to be written to a nonvolatile memory corresponds to a write cache hit with respect to a write cache in step 510. Whether the data write is a write cache hit is checked in step 520. If it is a write cache hit (i.e., "yes path"), the current data is written to the write cache as well as to a designated location in the nonvolatile memory different from a destined location in the nonvolatile memory in step 530, where said writing the current data to the designated location in the nonvolatile memory different from a destined location in the nonvolatile memory is referred as a logging write. If it is not a write cache hit (i.e., "no path"), the current data is written to the destined location in the nonvolatile memory in step 540.

Figure 6:
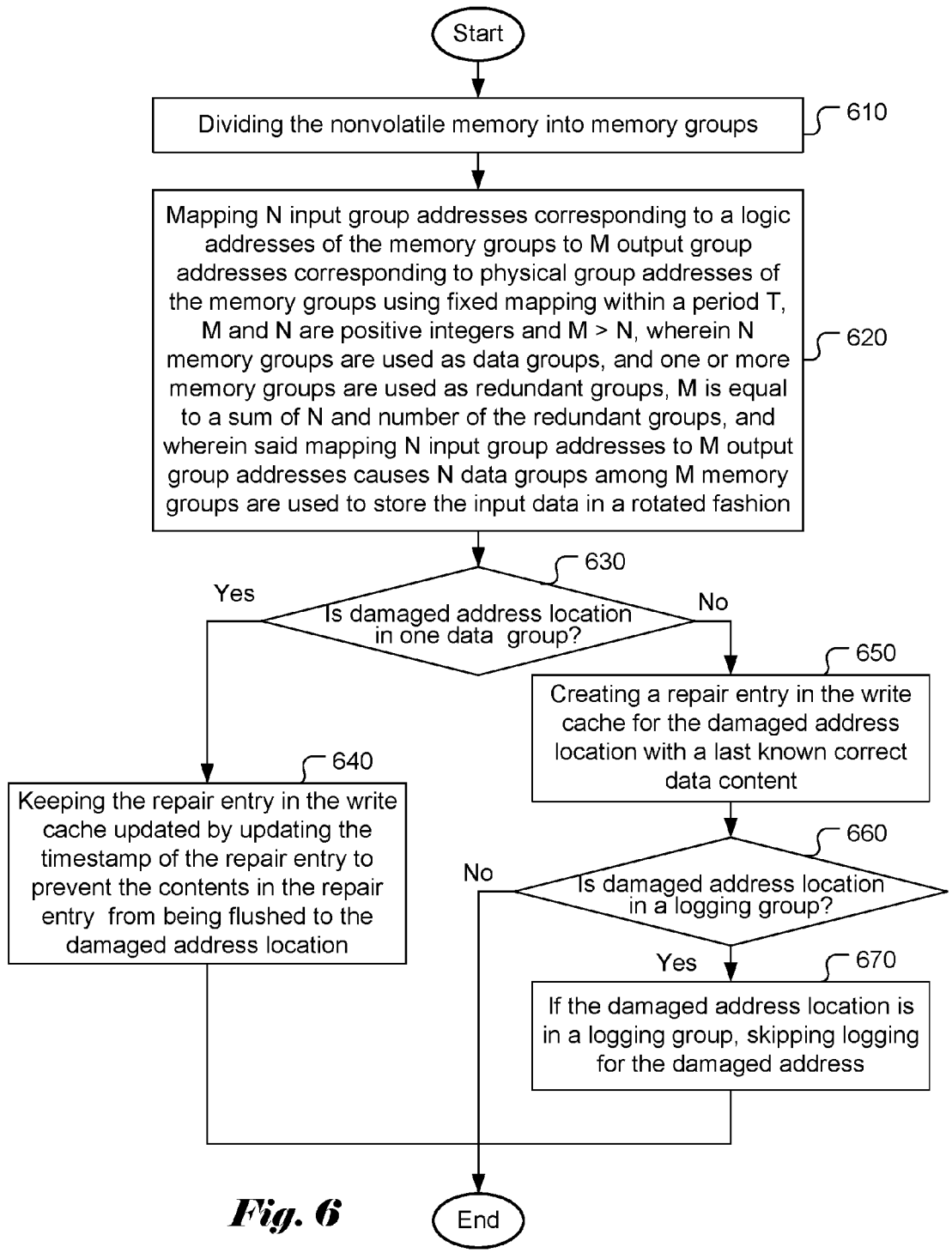
FIG. 6 illustrates an exemplary flowchart of damage recovery for a storage class memory (SCM) with wear leveling capability according to an embodiment of the present invention.

FIG. 6 illustrates an exemplary flowchart of damage recovery for storage class memory based on nonvolatile memory using a write cache according to one embodiment of the present invention, where the input data is written to a selected write cache location as well as a selected nonvolatile memory location, the selected write cache location includes a timestamp, and contents in the selected nonvolatile memory location are flushed to a destined location in the nonvolatile memory if the timestamp indicates that the in the selected nonvolatile memory location are aged. The method divides the nonvolatile memory into memory groups in step 610. N input group addresses corresponding to a logic addresses of the memory groups are mapped to M output group addresses corresponding to physical group addresses of the memory groups using fixed mapping within a period T in step 620, M and N are positive integers and M>N. N memory groups are used as data groups, and one or more memory groups are used as redundant groups, M is equal to a sum of N and number of the redundant groups, and where mapping N input group addresses to M output group addresses causes N data groups among M memory groups are used to store the input data in a rotated fashion. Whether a damaged address location in one data groups is check in step 630. The result is "yes", the flow goes to step 640. Otherwise (i.e., the "no path"), the flow goes to step 650. In step 640, the repair entry in the write cache is kept updated by updating the timestamp of the repair entry to prevent the contents in the repair entry from being flushed to the damaged address location. In step 650, a repair entry in the write cache is created for the damaged address location with the last known correct data content. Whether the damaged address location is in a logging group is checked in step 660. If the damaged address location is in a logging group (i.e., the "yes" path), the location shall be spared from logging as shown in step 670. Otherwise, step 670 will be skipped.

Figure 7:
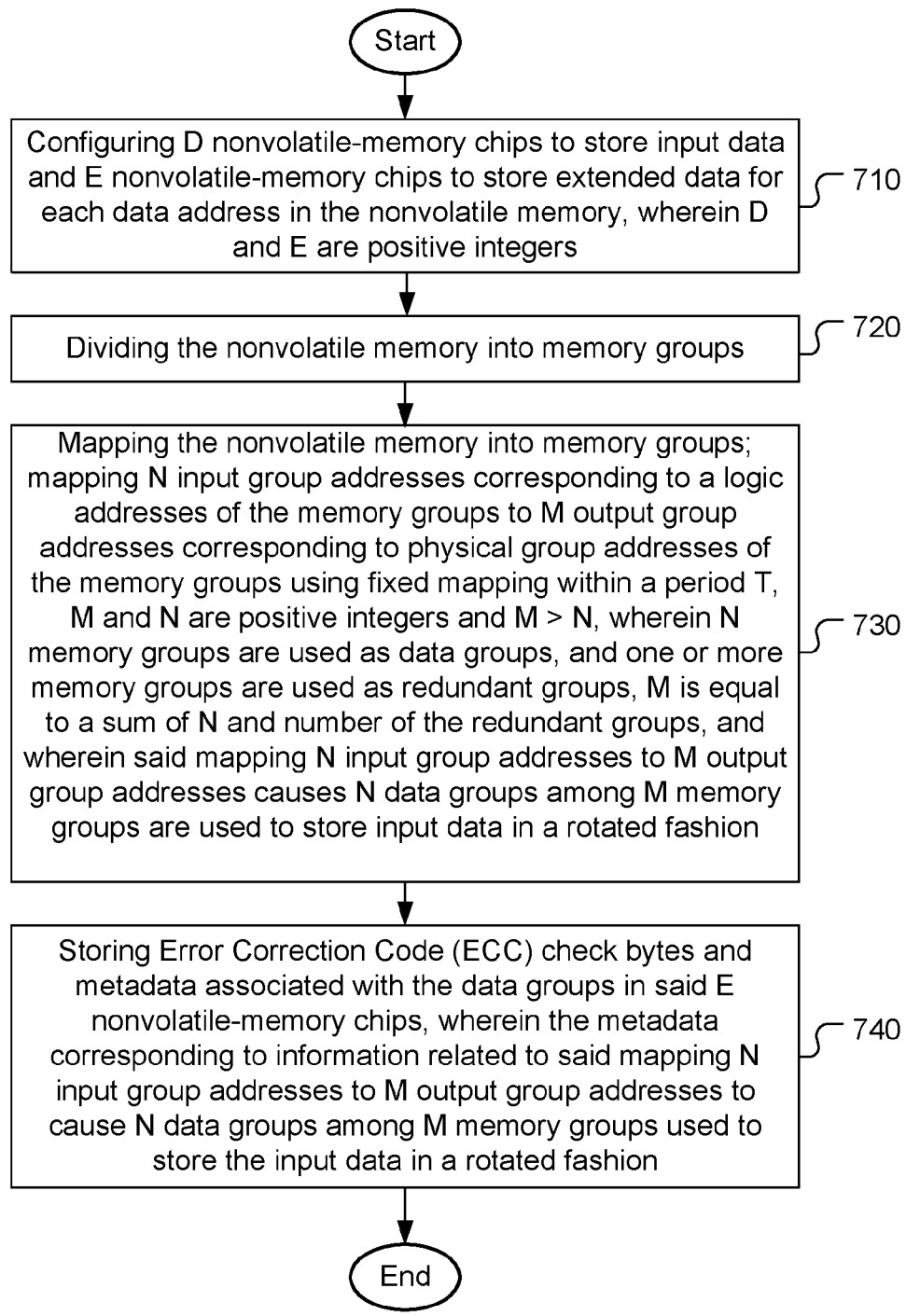
FIG. 7 illustrates an exemplary flowchart of sharing ECC (Error Correcting Codes) check bytes and metadata associated with address rotation in same nonvolatile chip(s) of the nonvolatile memory for a storage class memory (SCM) with wear leveling capability according to an embodiment of the present invention.

FIG. 7 illustrates an exemplary flowchart of sharing ECC (Error Correcting Codes) check bytes and metadata associated with address rotation in same nonvolatile chip(s) of the nonvolatile memory for a storage class memory (SCM) with wear leveling capability according to an embodiment of the present invention. The method configures D nonvolatile-memory chips to store input data and E nonvolatile-memory chips to store extended data for each data address in the nonvolatile memory as shown in step 710, where D and E are positive integers. The nonvolatile memory is divided into memory groups in step 720. N input group addresses corresponding to a logic addresses of the memory groups are mapped to M output group addresses corresponding to physical group addresses of the memory groups using fixed mapping within a period T in step 730. M and N are positive integers and M>N. N memory groups are used as data groups, and one or more memory groups are used as redundant groups, M is equal to a sum of N and number of the redundant groups. Mapping N input group addresses to M output group addresses causes N data groups among M memory groups are used to store input data in a rotated fashion. Error Correction Code (ECC) check bytes and metadata associated with the data groups and the redundant groups are stored in E nonvolatile-memory chips in step 740, where the metadata corresponding to information related to said mapping N input group addresses to M output group addresses to cause N data groups among M memory groups used to store the input data in a rotated fashion.

The flowcharts shown above are intended to illustrate examples of wear leveling control, damage recovery and shared ECC and metadata memory incorporating embodiments of the present invention. A person skilled in the art may modify each step, re-arranges the steps, split a step, or combine the steps to practice the present invention without departing from the spirit of the present invention.

The above description is presented to enable a person of ordinary skill in the art to practice the present invention as provided in the context of a particular application and its requirement. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed. In the above detailed description, various specific details are illustrated in order to provide a thorough understanding of the present invention. Nevertheless, it will be understood by those skilled in the art that the present invention may be practiced.

Embodiment of the present invention as described above may be implemented in various hardware, software codes, or a combination of both. For example, an embodiment of the present invention can be a circuit integrated into a video compression chip or program code integrated into video compression software to perform the processing described herein. These processors can be configured to perform particular tasks according to the invention, by executing machine-readable software code or firmware code that defines the particular methods embodied by the invention.

The software code or firmware code may be developed in different programming languages and different formats or styles. The software code may also be compiled for different target platforms. However, different code formats, styles and languages of software codes and other means of configuring code to perform the tasks in accordance with the invention will not depart from the spirit and scope of the invention.

The invention may be embodied in other specific forms without departing from its spirit or essential characteristics. The described examples are to be considered in all respects only as illustrative and not restrictive. The scope of the invention is therefore, indicated by the appended claims rather than by the foregoing description. All changes which come within the meaning and range of equivalency of the claims are to be embraced within their scope.

The invention claimed is:

1. A method of wear leveling control for storage class memory based on nonvolatile memory using a write cache, the method comprising:

determining whether current data to be written to the nonvolatile memory corresponds to a write cache hit, wherein the write cache hit indicates that the current data to be written to the nonvolatile memory is in the write cache;

if the current data to be written corresponds to the write cache hit, writing the current data to the write cache as well as to a designated location in the nonvolatile memory different from a destined location in the nonvolatile memory, wherein said writing the current data to the designated location in the nonvolatile memory different from the destined location in the nonvolatile memory is referred as a logging write; and if the current data to be written corresponds to a write cache miss, writing the current data to the destined location in the nonvolatile memory, wherein the write cache miss indicates that the current data to be written to the nonvolatile memory is not in the write cache.

2. The method of claim 1, further comprising writing the current data to the write cache also if the current data to be written corresponds to the write cache miss and the write cache is not full.

3. The method of claim 1, wherein, when the current data is written to the write cache as well as to the designated location in the nonvolatile memory different from the destined location in the nonvolatile memory in a case of the write cache hit, a dirty bit of a cache entry for the current data is set to indicate that a cache entry content is different from a data content of the destined location in the nonvolatile memory.

4. The method of claim 1, wherein, when one write cache entry is retired and when a dirty bit of said one write cache entry is set, said one write cache entry is flushed to a corresponding destined location in the nonvolatile memory.

5. The method of claim 1, wherein a portion of unused memory space of the nonvolatile memory is designated as a logging region used for the logging write and the unused memory space of the nonvolatile memory corresponds to memory space not used as destined locations for storing data.

6. The method of claim 1, further comprising:

dividing the nonvolatile memory into memory groups; and mapping an input group address corresponding to a logic address of one memory group in the nonvolatile memory to an output group address corresponding to a physical group address of one memory group in the nonvolatile memory, wherein the input group address belongs to a first set of N addresses and the output group address belongs to a second set of M addresses, M and N are positive integers and M>N, and wherein at least one input address is mapped to two different output addresses at two different time instances.

7. The method of claim 6, wherein N memory groups are used as data groups and one or more memory groups are used as redundant groups, and M is equal to a sum of N and number of the redundant groups, and wherein the redundant groups are divided into one or more logging groups and a shadow group in unused memory space of the nonvolatile memory and the unused memory space of the nonvolatile memory corresponds to memory space not used as destined locations for storing data.

8. The method of claim 7, wherein said mapping the input group address to the output group address are fixed within a first time period and modifies only one of the first set of N addresses to a different output group address in each next first time period.

9. The method of claim 6, further comprising background copying, wherein said background copying comprises copying contents of one of the data groups, called a sunset group, to the shadow group.

10. The method of claim 9, wherein said background copying is performed at an interval equal to the first time period, and the first time period is chosen to be substantially larger than background copying process time.

11. The method of claim 10, further comprising, after the first time period from said background copying, assigning the shadow group an identity of a previous sunset group; then assigning the shadow group to one of the data groups; then assigning the sunset group to the redundant groups as one of the logging groups; and then assigning one of the logging groups as a new shadow group.

12. The method of claim 7, further comprising partitioning said one or more logging groups into a group of logging units by partitioning each of said one or more logging groups into multiple logging units; and writing the data and an original input address to one of the group of logging units referred as an active logging unit when the write cache hit happens, wherein a current pointer is assigned to point to a next logging entry within the active logging unit and to cause the group of logging units written sequentially.

13. The method of claim 12, wherein said mapping the input group address to the output group address are fixed within a first time period and modifies only one of the first set of N addresses to a different output group address in each next first time period, and writing to the group of logging units moves to a next logging unit for every second time period, tL, and tL is substantially smaller than the first time period.

14. The method of claim 13, wherein the logging write also stores a timestamp to indicate during which second time period, tL that one corresponding write entry was last updated and the timestamp is incremented by one for every second time period, tL.

15. The method of claim 14, further comprising when a power loss occurs, examining the timestamps in the group of logging units to determine a last active logging unit prior to the power loss and to determine which logging unit needs to be restored.

16. The method of claim 7, further comprising assigning one group label to each group to identify each group as one data group, one sunset group, one shadow group or one logging group.

17. The method of claim 16, wherein group labels for the memory groups are also stored in the nonvolatile memory to allow a state of said mapping the input group address to the output group address restored after a power loss.

18. An apparatus for wear leveling control for storage class memory, the apparatus comprising:
- a cache memory;
- a storage class memory (SCM) controller coupled to the cache memory and a nonvolatile memory; and
- one or more processors;
- wherein the cache memory, the SCM controller and said one or more processors are configured to perform at least the following:
  - determining whether current data to be written to the nonvolatile memory corresponds to a write cache hit, wherein the write cache hit indicates that the current data to be written to the nonvolatile memory is in the write cache;
  - if the current data to be written corresponds to the write cache hit, writing the current data to the write cache as well as to a designated location in the nonvolatile memory different from a destined location in the nonvolatile memory; and
  - if the current data to be written corresponds to a write cache miss, writing the current data to the destined location in the nonvolatile memory, wherein the write cache miss indicates that the current data to be written to the nonvolatile memory is not in the write cache.

19. The apparatus of claim 18, wherein the cache memory, the SCM controller and said one or more processors are configured to further perform at least the following:
- dividing the nonvolatile memory into memory groups; and
- mapping an input group address corresponding to a logic address of one memory group in the nonvolatile memory to an output group address corresponding to a physical group address of one memory group in the nonvolatile memory, wherein the input group address belongs to a first set of N addresses and the output group address belongs to a second set of M addresses, M and N are positive integers and M>N, and wherein at least one input address is mapped to two different output addresses at two different time instances.

* * * * *